United States Patent [19]
Durand

[11] Patent Number: 6,154,023
[45] Date of Patent: Nov. 28, 2000

[54] REMOTE CURRENT SENSOR

[75] Inventor: Dominique M. Durand, Solon, Ohio

[73] Assignee: Case Western Reserve University, Cleveland, Ohio

[21] Appl. No.: 09/099,237

[22] Filed: Jun. 15, 1998

Related U.S. Application Data

[62] Division of application No. 08/588,128, Jan. 18, 1996, Pat. No. 5,767,668.

[51] Int. Cl.$^7$ .................................................... G01R 33/06
[52] U.S. Cl. ........................................ 324/117 R; 324/127
[58] Field of Search ........................... 324/117 H, 117 R, 324/127, 126; 702/64, 65

[56] References Cited

U.S. PATENT DOCUMENTS

| | | | |
|---|---|---|---|
| 4,395,677 | 7/1983 | Petersdorf | 324/117 H |
| 5,473,244 | 12/1995 | Libove et al. | 324/126 |
| 5,570,034 | 10/1996 | Needham et al. | 324/117 H |

*Primary Examiner*—Ernest Karlsen
*Attorney, Agent, or Firm*—Fay, Sharpe, Fagan, Minnich & McKee, LLP

[57] ABSTRACT

A remote non-invasive current sensing apparatus for sensing current being carried through a conductor located beneath or on top of a surface. First and second magnetic field sensor elements are placed in operative connection with the surface. There is no requirement to insert the sensor element within the current line by cutting the line or to encircle/enclose the conductor within a coil or other element. The second magnetic field sensor is located a predetermined distance from the first magnetic field sensor. The outputs of the magnetic field sensors are amplified and then provided to a processor which calculates the amplitude of the current in the conductor and the distance of the conductor is from the surface.

21 Claims, 4 Drawing Sheets

REMOTE CURRENT SENSOR

This is a divisional of application Ser. No. 08/588,128 filed Jan. 18, 1996 now U.S. Pat. No. 5,767,668.

BACKGROUND OF THE INVENTION

This invention pertains to the art of current sensing and more particularly to a remote non-invasive current sensor which senses current in a conductor located on a surface or below the surface of an object under test.

The invention is particularly applicable to the measurement of current in devices implanted within a human body, such as pacemakers. A further application is in non-biological settings including the servicing of electrical/electronic devices, testing of electronic circuit boards, and in the manufacturing of electrical/electronic equipment. It will be appreciated, however, that the invention has broader applications and may be advantageously employed in other embodiments and applications where access to current carrying conductors is difficult.

The measurement of current is necessary in many situations including development, testing, maintenance, and servicing of electrical/electronic devices. One such implementation is found in the medical field where it is desired to measure the current within a device implanted in a patient. Another area of use is in the measurement of current on a circuit board of an electrical/electronic device. The current carrying conductor in these situations may be either attached to a surface, or imbedded within the object under test. In either situation, sensing current is difficult, due to the location of the conductor.

Presently, there are two common current measurement techniques. The first technique involves physically cutting the conductor to allow insertion of a current measuring device. This technique cannot be used in many settings such as when the conductor is in a pacemaker implanted in a patient or when the conductor is attached to a circuit board.

Another current sensing technique involves surrounding the conductor in a coil, such as toroid coils, or other element which acts to concentrate electromagnetic waves. When toroid coils are used, the sensors are made to vary in direct proportion to the magnetic field to thereby obtain a current output.

Other current sensing devices which surround the conductor employ magneto-resistive elements such as those described in Baran, et al. U.S. Pat. No. 4,857,837. This patent teaches a current sensor with a magneto-resistive sensor having high fidelity of output. This current sensor is described as including a magnetic flux concentrator substantially encircling the electrical conductor. A patent to Milkovic U.S. Pat. No. 4,414,510 discloses a sensing system and method employing an anisotropic magneto-resistive ferrite member. Disclosed is a sensor having anisotropic magneto-resistive properties, where the conductor is encircled by an insulating surface and a permanently magnetized ferromagnetic member.

Among the drawbacks in existing current sensing techniques is a requirement of either cutting the conductor carrying the current or requiring the conductor to be encircled/enclosed within the sensor element. These techniques do not teach an easy manner of measuring current in a conductor attached to a surface of or embedded within an object or in other hard to access locations.

Therefore, it has been deemed desirable to develop a current sensor device which does not require cutting a conductor to insert the sensor device or require encircling/enclosing the conductor within the sensor device. Further, the sensor device should be able to measure current in conductors located below a surface of an object, as well as current in conductors attached to the surface of an object. It is further desirable to provide for the localization of the wire carrying the measured current and to obtain miniaturization of the sensors.

SUMMARY OF THE INVENTION

The present invention contemplates a new and improved current sensor device that overcomes all of the above noted problems and others, can be used to sense current in conductors located beneath or at the surface of an object under test at locations difficult to reach with existing current sensors, through the use of a non-evasive remote current sensor.

According to a more limited aspect of the invention, the current sensor includes first and second magnetic field sensor elements located at a surface of the object having a current carrying conductor such that the first magnetic field sensor is in operative connection with the conductor. The second magnetic field sensor is placed at the surface of the object a predetermined distance from the first magnetic field sensor. Each of the first and second magnetic field sensors sense magnetic fields and generate first and second signals which are amplified and processed to determine the current flow.

In a more limited aspect of the present invention, when the conductor is located beneath the surface of the object under test the magnetic field sensors are used to calculate the distance the conductor is located from the surface of the object.

According to yet another aspect of the invention, the first and second magnetic field sensors are connected in an additive configuration to calculate the current.

According to a still further aspect of the invention, the first and second magneto-sensors are connected in a differential configuration to cancel noise.

A principal advantage of the present invention is the provision of a current sensor which may be used to measure current carrying conductors located in hard to reach locations.

Another advantage of the invention resides in the ease with which the current sensor can be used to measure current carrying conductors located beneath a surface, or on a surface of an object.

Still another advantage of the invention is the miniaturization of the sensor device.

Still other advantages and benefits of the invention will become apparent to those skilled in the art upon a reading and understanding of the following detailed description.

BRIEF DESCRIPTION OF THE DRAWINGS

The invention may take physical form in certain parts and arrangements of parts, a preferred embodiment of which will be described in detail in this specification and illustrated in the accompanying drawings which form a part hereof, and wherein.

DETAILED DESCRIPTION OF THE PREFERRED EMBODIMENT

Figure 1A:
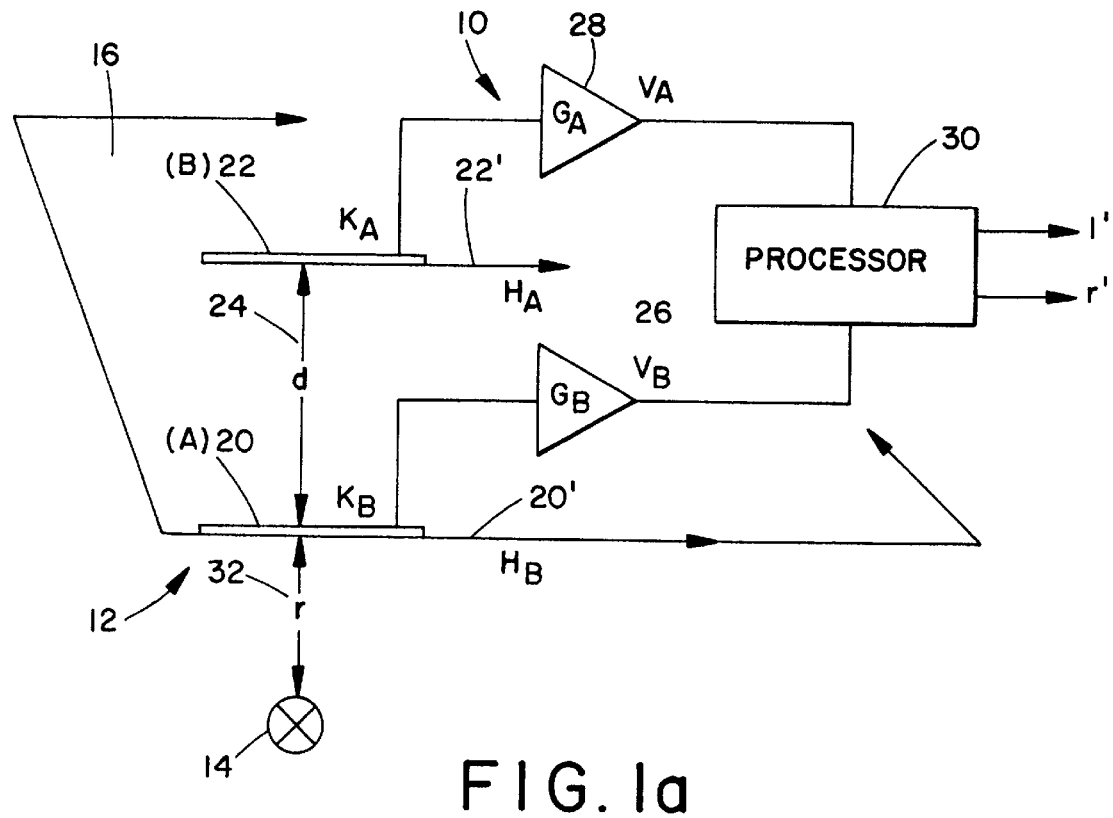
FIG. 1a illustrates a sensing device according to the subject invention for measuring the amplitude of current carried in a conductor and the distance the conductor is from a surface.

Referring now to the drawings wherein the showings are for purposes of illustrating the preferred embodiment of the invention only and not for limiting same. FIG. 1a provides a block diagram of a sensor device 10 according to the subject invention. Object 12 has a conductor 14 located beneath surface 16. A first magnetic field sensor A, 20, is placed at or immediately above surface 16 over conductor 14. A second magnetic field sensor, B, 22 is located over conductor 14 a predetermined distance, d, 24 above first magnetic field sensor 20, such that the magnetic fields 20' and 22' sensed by magnetic field sensors 20 and 22 are of the same direction. The outputs of magnetic field sensors 20 and 22 are provided to inputs of amplifiers 26 and 28 respectively. Thereafter, the outputs from amplifiers 26 and 28 are inputted to processor 30, which is used to calculate the current flowing in conductor 14 based on magnetic fields sensed by magnetic field sensors 20 and 22.

The above arrangement allows for the use of commercially available sensitive magnetic field sensors to measure a magnetic field remotely. Such sensors may include but are not limited to magneto-sensors such as the Phillips K210. The circuit 10 uses amplifiers 26, 28 and processor 30 to generate a calculated value representing the current in conductor 14. Using sensor device 10 it is also possible to calculate the distance, r, 32 conductor 14 is located beneath surface 16.

In the above embodiment sensor device 10 operates in accordance with the following parameters. Particularly, the output of each magnetic field sensor 20, 22 is amplified and given by the equations:

$$V_B = K_B G_B H_B \quad (1)$$

$$V_A = K_A G_A H_A, \quad (2)$$

where $K_A$, $K_B$ represent the sensitivity of the magnetic field sensors 20, 22, $G_A$, $G_B$ represent the gain of amplifiers 26, 28, and $H_A$, $H_B$ represent the magnetic fields generated by current at each respective magnetic field sensor.

By applying Ampere's law, the magnetic fields can be expressed by:

$$H_A = \mu I/2\pi(r+d) \quad (3)$$

$$H_B = \mu I/2\pi r, \quad (4)$$

where $\mu$ is the permeability of the medium below and above the surface 16.

Adjusting the gains of the amplifiers 26 and 28 such that, $$K_A G_A = K_B G_B = A, \quad (5)$$

the distance, r, 32 and the amplitude of the current, I, are calculated as follows:

$$I = (2\pi d/A\mu) V_A V_B/(V_B - V_A), \quad (6)$$

$$r = dV_A/(V_B - V_A). \quad (7)$$

Using the above calculations and configuration of circuit 10, the value of current flowing through conductor 14, located within an object such as the human body or within an electrical device, can be obtained without requiring invasive techniques or encircling the conductor as necessary in existing current sensing devices.

Figure 1B:
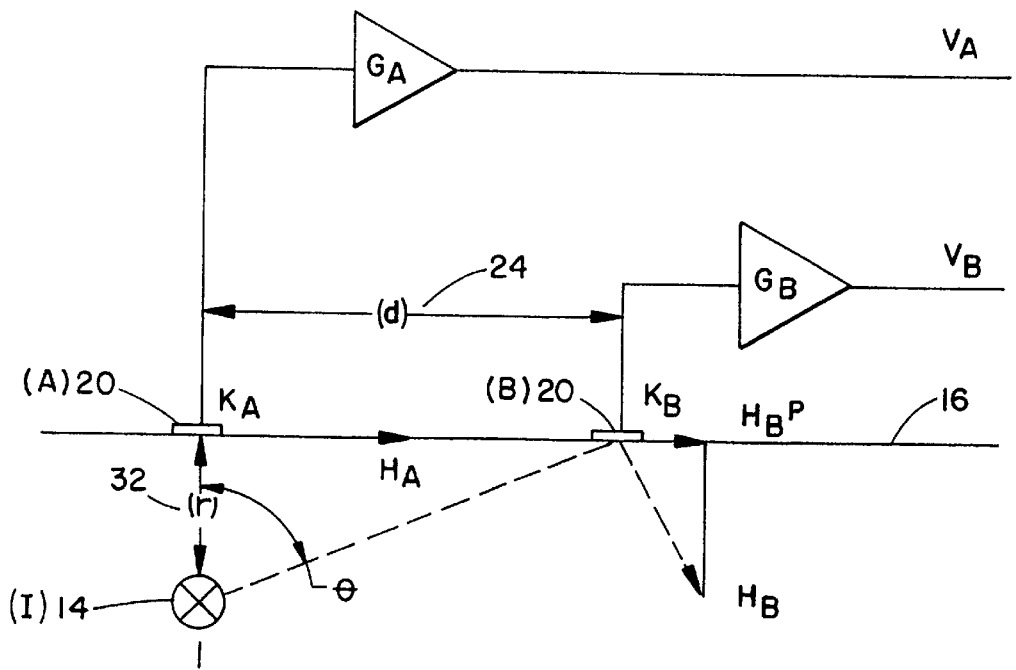
FIG. 1b illustrates another manner of using the sensing device to measure current carried in the conductor and the distance the conductor is from the surface.

With attention to FIG. 1b, each of magnetic field sensors 20 and 22 are located in the same horizontal plane, which is on or immediately above surface 16, with first magnetic field sensor 20 located over conductor 14 and second magnetic field sensor 22 located a distance, d, 24 from conductor 14. Using this configuration the current flowing through conductor 14 and the distance conductor 14 is below surface 16 can be found by the following calculations, when quasi-static conditions exist, such as the frequency of current being below 10 kHz.

The output from each sensor is amplified and given by the equations:

$$V_A = K_A G_A H_A \quad (8)$$

$$V_B = K_B G_B H_B^P, \quad (9)$$

where $H_A$ represents the magnetic field generated by the current carrying conductor, I, 14 at sensor 20, $H_B^P$ represents the projection of the magnetic field at sensor 22 along surface 16, $K_A$, $K_B$ represent the sensitivity of the sensors, and $G_A$, $G_B$ the gain of the amplifier, 30. Using Ampere's Law to evaluate the magnetic field at sensors 20, and 22:

$$V_A = \frac{K_A G_A \mu I}{2\pi r} \quad (10)$$

By taking the ratio of $V_B$ over $V_A$, the angle $\theta$ can be calculated by:

$$\theta = \cos^{-1}\left(\sqrt{\frac{V_B}{V_A} \times \frac{K_A G_A}{K_B G_B}}\right) \quad (11)$$

The distance r and the amplitude of the current I can be calculated as follows:

$$r = \frac{d}{tg(\theta)} \quad (12)$$

$$I = \frac{2\pi r}{\mu G_A} \frac{V_A}{K_A} \quad (13)$$

Figure 2:
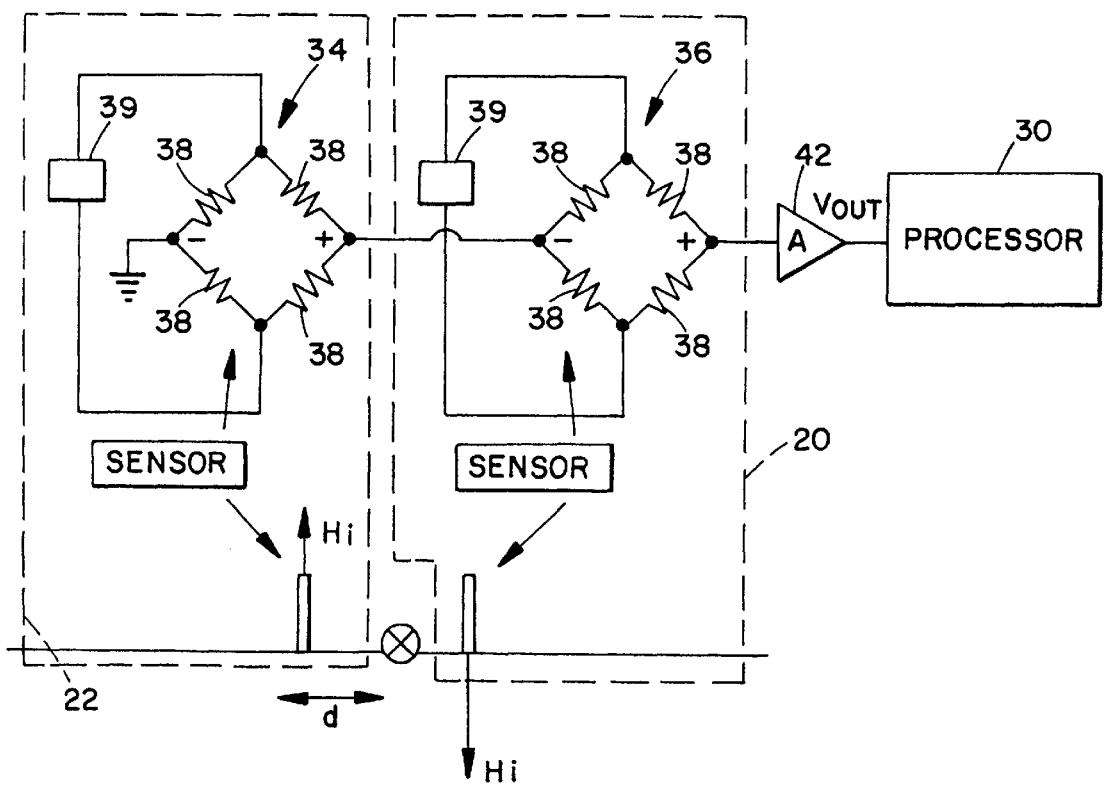
FIG. 2 is an illustration of the non-invasive current sensor measuring device according to the subject invention for measuring current in a conductor located on a surface of an object under test using an additive sensing configuration.

With attention to FIG. 2, another non-invasive remote current measurement situation is illustrated where conductor 14 is located on surface 16 of object 12. The magnetic field sensors 20 and 22 are now more particularly illustrated as each consisting of bridges 34, 36 of magnetic resistive elements 38 sensitive to magnetic fields in specific directions, which are connected to each other in an additive manner. Using magnetic field sensors of this type, it is necessary to predefine the direction of the current sensing. This may be accomplished by applying a predetermined magnetic field to the magnetic field sensors 20, 22 prior to current sensing. Once magnetic field sensors 20, 22 have been adjusted in the appropriate manner, they are placed a predetermined distance, d, 24 on either side of conductor 14.

Each of the sensors 20, 22 includes a source of energy such as, but not limited to, constant current supplies 39, with a floating ground or other appropriate grounding technique.

The bridge circuits 34 and 36 are shown in an additive configuration so the voltage output $V_{out}$ is directly proportional to the current I in conductor 14 and may be calculated according to:

$$V_{out} = A(K_A + K_B)\mu I / 2\pi d, \tag{14}$$

where K represents the sensitivity of the magnetic field sensors, and $\mu$ represents the permeability of the medium surface 16. This distance can be measured visually and the current can be estimated by:

$$I = V_{out} 2\pi d / (K_A + K_B) A\mu. \tag{15}$$

The output from the bridges 34, 36 of magnetic field resistive elements is amplified by amplifier 42 and then passed to processor 30. Within processor 30 the calculations for obtaining calculated current flow are carried out using equation 15. It is to be understood that such calculations are well known within the art and one of ordinary skill would understand how such calculations can be obtained.

Figure 3A:
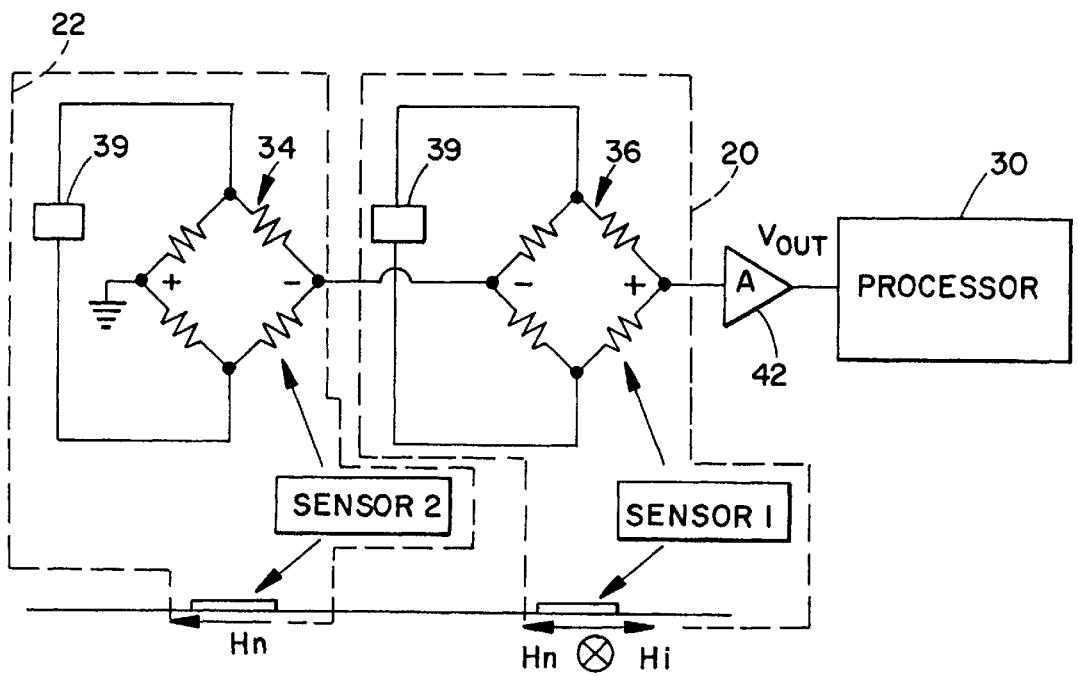
FIG. 3a illustrates a differential configuration which uses magnetic field sensors to eliminate noise.

FIG. 3a provides a differential sensing configuration for sensor device 10, to minimize magnetic noise from the surrounding environment. In this embodiment, magnetic field sensor 20 is located immediately above conductor 14. Therefore, magnetic field sensor 20 senses both the magnetic field $H_i$ generated by current in conductor 14 as well as the contribution of noise in the magnetic field designated as $H_n$. Magnetic field sensor 22 is located a predetermined distance from the conductor 14 such that it will measure only the noise signal $H_n$. An example of noise detected by magnetic field sensor 22 is noise developed from a 60 Hz supply.

Bridges 34 and 36 are connected in series in a differential configuration. Particularly, the negative outputs of both bridges are connected to one another, the positive output of bridge 34 is connected to ground, and the positive output of bridge 36 is connected to amplifier 42. With such a differential output, when the magnetic field is common to both sensors 20 and 22, a difference signal generated between the two bridge outputs is amplified to remove the noise component. This signal is then further processed in processor 30, which includes well known elements such as a microprocessor, AD converter, memory, display and other elements used in the processing of signals. Using the configuration of FIG. 3a, it is possible to obtain a graphical representation of the sensed signal from conductor 14, it is not, however, possible to obtain the value of that signal, i.e. value of the current.

Figure 3B:
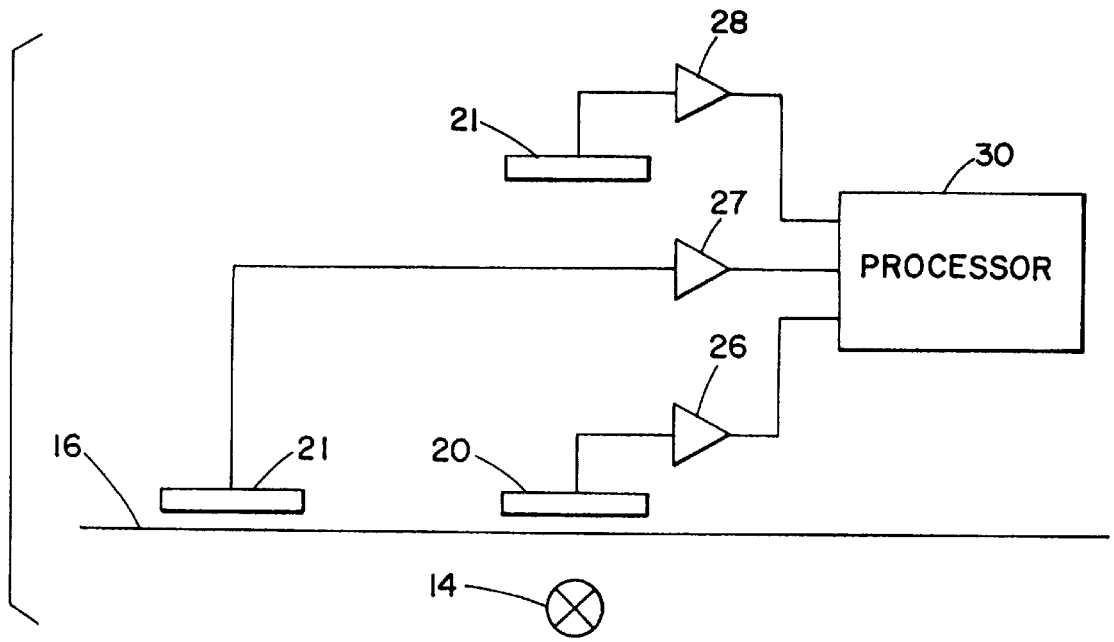
FIG. 3b is a current sensor device according to the subject invention which measures current using the differential configuration of FIG. 3a to eliminate noise.

FIG. 3b illustrates sensing device 10, according to the subject invention incorporating the noise minimization techniques of FIG. 3a. Using the circuit of FIG. 3b, however, it is possible to also determine the calculated value of the current in conductor 14. This is accomplished by the use of at least additional sensor 21 in a manner as described in connection with FIG. 1a, wherein sensor 21 is located above sensor 20. It is to be appreciated that additional sensor 21 may also be used as described in FIG. 1b (i.e., in the same horizontal plane as sensor 20) or FIG. 2 (where sensors 20 and 21 are placed a predetermined distance on either side of conductor 14) under the appropriate circumstances. In FIG. 3b the output from sensors 20, 21 and 22 are supplied to respective amplifiers 26, 27 and 28 whose outputs are in turn supplied to processor 30. The device of FIG. 3b is configured such that the output of amplifier 26 is subtracted from the output of amplifier 27 to obtain $V_A$ and the output of amplifier 28 is subtracted from the output of amplifier 27 to obtain $V_B$. After obtaining these values, the previously discussed calculations can be used to obtain the current in conductor 14. It is to be recognized, that the differential circuit of FIG. 3b may also be implemented with a fourth sensor.

Figure 4:
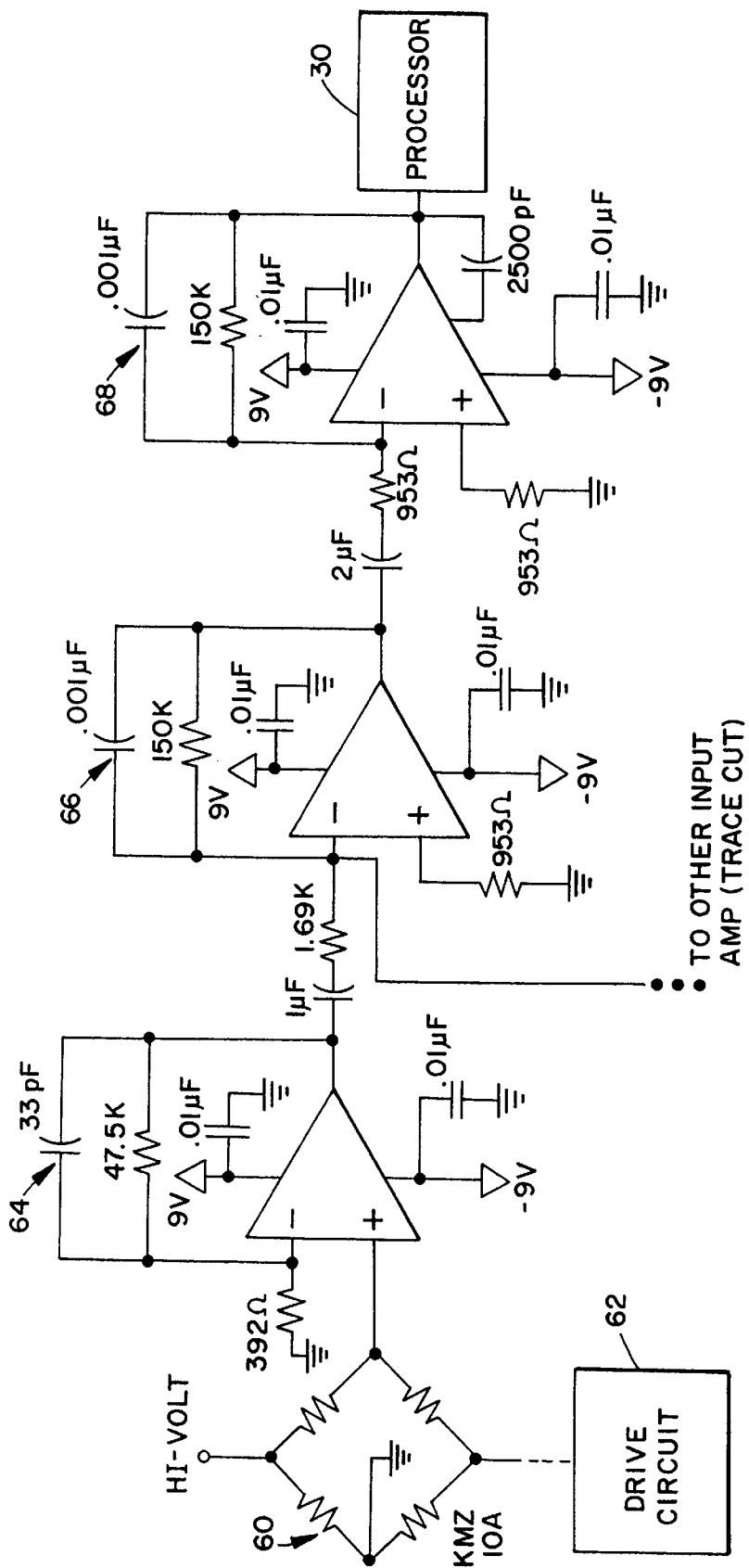
FIG. 4 shows a more detailed embodiment of a sensor element according to the subject invention.

FIG. 4 sets forth a more detailed illustration of a low noise amplifier circuit for use with one of magnetic field sensors 20, 22 and amplifiers 26, 28 used in the subject invention. Particularly, bridge 60, which may be thought of as equivalent to one of bridges 34 and 36, is controlled by drive circuit 62. This drive circuit 62 is configured as a constant current source with floating ground. Such a configuration is within the understanding of one skilled in the art and therefore further discussion is not believed necessary. An output from bridge 60 is fed to a low noise voltage amplifier 64 having a gain of approximately 122. Additional amplifiers 66 and 68 provide further amplification within desired frequency ranges. Particularly, amplifier 66 has a mid-band gain of 89 and a high pass frequency at 100 Hz and a low pass frequency at 1K Hz. Amplifier 68 has a mid-band gain of 157, a high pass frequency at 80 Hz and an low pass frequency at 1K Hz. Two such output amplifiers are built for each sensor and their outputs are then supplied to the processor 30 to be used in calculating the current in conductor 14.

Figure 5:
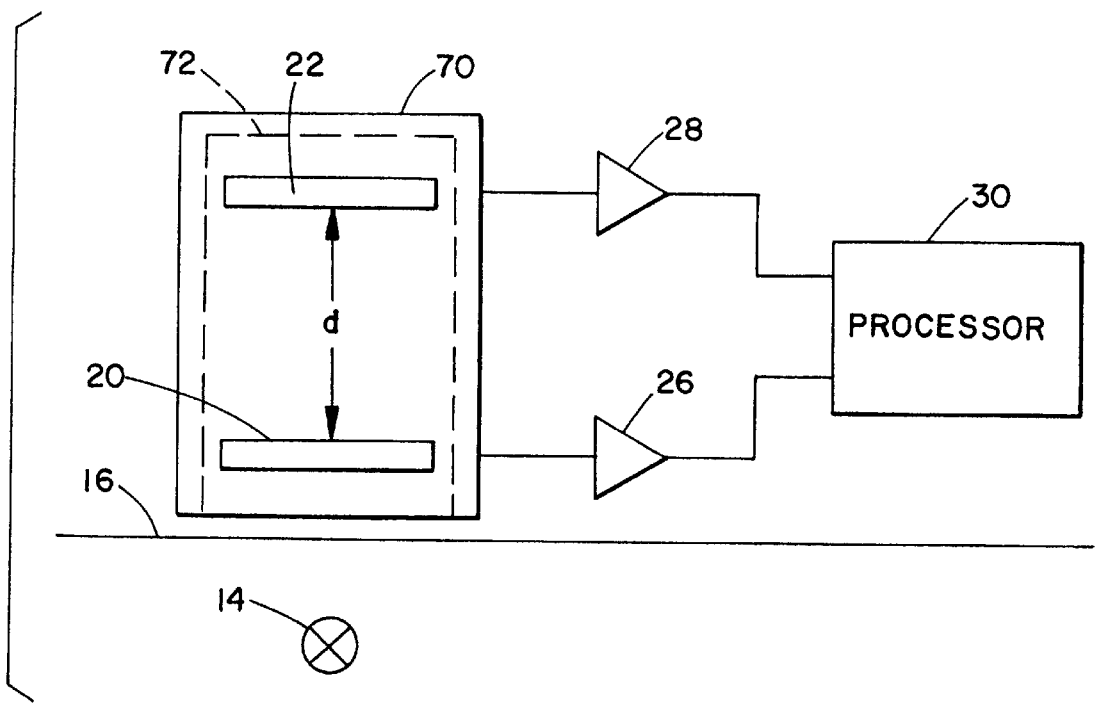
FIG. 5 shows the current sensing device of the subject invention packaged with a noise reducing shield.

As illustrated in FIG. 5 the sensor device 10 may be configured in a package 70 where the distance, d, 24 between sensors 20, 22 is fixed. Also, the package 70 can include additional noise shielding elements 72 such as aluminum or other known elements to improve the accuracy of the calculated current values sensed.

It is to be appreciated that the output from the sensors which has been processed by the processor can be displayed as digital readouts, on graphic displays or some other manner for observation by a user.

It is to be further appreciated, that since it is not necessary to encircle or enclose the conductor within sensors, it is possible to miniaturize the sensor device according to the subject invention.

The invention has been described with reference to the preferred embodiment. Obviously modifications and alterations will occur to others upon a reading an understanding of this specification. It is intended to include all such modifications and alterations insofar as they come within the scope of the appended claims or the equivalents thereof.

I claim:

1. A method of non-invasive sensing of current through a conductor located a distance beneath a surface, the method comprising:

positioning a first magnetic field sensor configured to sense magnetic fields of the conductor located beneath the surface, wherein the first magnetic field sensor and the conductor are physically separated from each other such that there is no overlap between the first magnetic field sensor and the conductor;

positioning a second magnetic field sensor configured to sense magnetic fields of the conductor, at a location distanced from the first magnetic sensor, wherein the second magnetic field sensor and the conductor are physically separated from each other such that there is no overlap between the second magnetic field sensor and the conductor;

sensing with the first magnetic field sensor a magnetic field generated by current in the conductor;

sensing with the second magnetic field sensor the magnetic field generated by current in the conductor;

generating a first signal from the magnetic field sensed by the first magnetic field sensor;

generating a second signal from the magnetic field sensed by the second magnetic field sensor;

amplifying the first signal by a first amplifier;

amplifying the second signal by a second amplifier; and processing the amplified first signal and amplified second signal.

2. The method according to claim 1 wherein sensitivity of the first magnetic field sensor and gain of the first amplifier are made equal to the sensitivity of the second magnetic field sensor and gain of the second amplifier.

3. The method according to claim 1 wherein the processing step includes calculating the current in the conductor.

4. The method according to claim 1 wherein the processing step includes calculating a distance the conductor is below the surface.

5. The method according to claim 1 further including a step of connecting the first and second magnetic field sensors in one of a differential configuration and an additive configuration.

6. A remote non-invasive current sensing method for sensing current through a conductor located substantially on a surface of an object or beneath a surface of the object, the method comprising:

positioning a first magnetic field sensor in operative connection with the conductor located substantially on a surface of the object or beneath the surface of the object, whereby the first magnetic field sensor is not able to encircle the conductor;

positioning a second magnetic field sensor in operative connection with the conductor located substantially on a surface of the object or beneath the surface of the object, the second magnetic field sensor at a location distanced from the first magnetic sensor;

placing a first amplifier in operative connection with the first magnetic field sensor; receiving an output from the first magnetic field sensor; amplifying the output;

placing a second amplifier in operative connection with the second magnetic field sensor; receiving an output from the second magnetic field sensor; amplifying the output;

processing amplifier output from the first and second amplifiers by a processor; and generating an output representative of current in the conductor.

7. The method according to claim 6 wherein the first and second magnetic field sensors are each comprised of a bridge of magneto-resistive elements.

8. The method according to claim 6 further including connecting the first and second magnetic field sensors to each other to produce an additive output.

9. The method according to claim 6 further including connecting the first magnetic field sensor and second magnetic field sensor to each other whereby, the first magnetic field sensor is located above the conductor and the second magnetic field sensor is located a predetermined distance from the first magnetic field sensor, such that while the first magnetic field sensor senses a noise signal and a signal of a magnetic field generated by current in the conductor, the second magnetic field sensor senses only the noise.

10. The method according to claim 9 further including connecting the first magnetic field sensor and second magnetic field sensor to each other to produce a differential output which cancels the signal from the noise sensed by the first and second magnetic field sensors.

11. The method according to claim 6 wherein the first and second magnetic field sensors are each comprised of a bridge of resistive elements sensitive to magnetic fields in specific directions.

12. The method according to claim 11 further including connecting the bridge of resistive elements of the first magnetic field sensor and the bridge of resistive elements of the second magnetic field sensor in an additive configuration.

13. The method according to claim 12 wherein the voltage output, $V_{out}$, is directly proportional to current wherein, $$V_{out}=A\mu I/d(K_A+K_B)$$

where K represents the sensitivity of the magnetic field sensors, $\mu$ represents the permeability of a medium below and above the surface, I represents current to be measured and d represents a distance the magnetic field sensor is from the conductor.

14. The method according to claim 6 wherein the amplified voltage output from the first amplifier is $V_A=K_A G_A H_A$, and the amplified voltage output from the second amplifier is one of $V_B=K_B G_B H_B$ and $V_B=K_B G_B H_B^P$, where $K_A$, $K_B$ represent the sensitivity of the sensors, $G_A$, $G_B$ represent the gain of the amplifiers, and $H_A$, $H_B$, $H_B^P$ are the magnetic fields generated by current at the sensors.

15. The method according to claim 6 wherein the magnetic fields $H_A$ and $H_B$ are, $$H_A=\mu I/2\pi(r+d), \text{ and } H_B=\mu I/2\pi r,$$

where $\mu$ is permeability I is current to be measured, r is distance the conductor is from the surface and d is the distance the magnetic field sensors are from each other.

16. The method according to claim 15 wherein, when the amplifier gains are made equal, a distance r, the conductor is from the surface of the object is one of, $$r=dV_A/(V_B-V_A), r=d/tg(\theta).$$

17. The method according to claim 16, wherein, when the amplifier gains are made equal, a current, I, is calculated according to:

$$I=(2\pi d/A\mu)V_A V_B/V_B-V_A.$$

18. The method according to claim 6, further including embedding the conductor within a living being.

19. The method according to claim 6, further including embedding the conductor within an electronic device.

20. The method according to claim 6, wherein the first magnetic field sensor and the conductor are physically separated from each other such that there is no overlap between the first magnetic field sensor and the conductor; and wherein the second magnetic field sensor is configured to sense magnetic fields of the conductor, at a location distanced from the first magnetic sensor, wherein the second magnetic field sensor and the conductor are physically separated from each other such that there is no overlap between the second magnetic field sensor and the conductor.

21. A remote non-invasive current sensing method for sensing current through a conductor located a distance beneath a surface, the method comprising:

configuring a first magnetic field sensor to sense magnetic fields of the conductor located beneath the surface, wherein the first magnetic field sensor and the conductor are physically separated from each other such that there is no overlap between the first magnetic field sensor and the conductor;

configuring a second magnetic field sensor to sense magnetic fields of the conductor, at a location distanced from the first magnetic sensor, wherein the second magnetic field sensor and the conductor are physically separated from each other such that there is no overlap between the second magnetic field sensor and the conductor;

positioning a first amplifier in operative connection with the first magnetic field sensor, to receive an output from the first magnetic field sensor and to amplify the output;

positioning a second amplifier in operative connection with the second magnetic field sensor, to receive an output from the second magnetic field sensor and to amplify the output; and receiving, by a processor, amplifier output from the first and second amplifiers; and generating an output representative of current in the conductor.

* * * * *